(12) United States Patent
Bolken

(10) Patent No.: US 6,747,345 B1
(45) Date of Patent: Jun. 8, 2004

(54) EXPOSED DIE MOLDING APPARATUS

(76) Inventor: Todd O. Bolken, 3881 Westpark Creek Dr., Meridian, ID (US) 83642

( * ) Notice: Subject to any disclaimer, the term of this patent is extended or adjusted under 35 U.S.C. 154(b) by 0 days.

(21) Appl. No.: 09/516,080

(22) Filed: Mar. 1, 2000

(51) Int. Cl.[7] .............................................. H01L 23/02
(52) U.S. Cl. ...................... 257/678; 257/687; 257/730; 257/773; 257/787; 257/795
(58) Field of Search .................. 257/666, 674, 257/676, 669, 670, 672, 677, 687, 730, 773, 787, 795; 438/106, 109, 123, 127

(56) References Cited

U.S. PATENT DOCUMENTS

| | | | | |
|---|---|---|---|---|
| 4,980,019 A | * | 12/1990 | Baerg et al. | 156/643 |
| 5,405,255 A | * | 4/1995 | Neu | 425/116 |
| 5,654,877 A | * | 8/1997 | Burns | 361/713 |
| 6,048,483 A | * | 4/2000 | Miyajima | 264/272.14 |
| 6,081,997 A | * | 7/2000 | Chia et al. | 29/841 |

* cited by examiner

*Primary Examiner*—Long Pham
*Assistant Examiner*—Wai-Sing Louie

(57) ABSTRACT

A method and apparatus for applying a protective ring about the perimeter of an exposed die face. Specifically, a semiconductor chip is coupled to the upper surface of a substrate. The edges of the semiconductor chip are protected by a molding compound which is disposed about the perimeter of the chip and on all or a portion of the substrate. The molding system which is used to apply the protective ring comprises three molding plates and does not require a vacuum-based system to hold the package stationary during the encapsulation process. By not applying a molding compound on the top surface of the semiconductor chip, no height is added to the package.

19 Claims, 4 Drawing Sheets

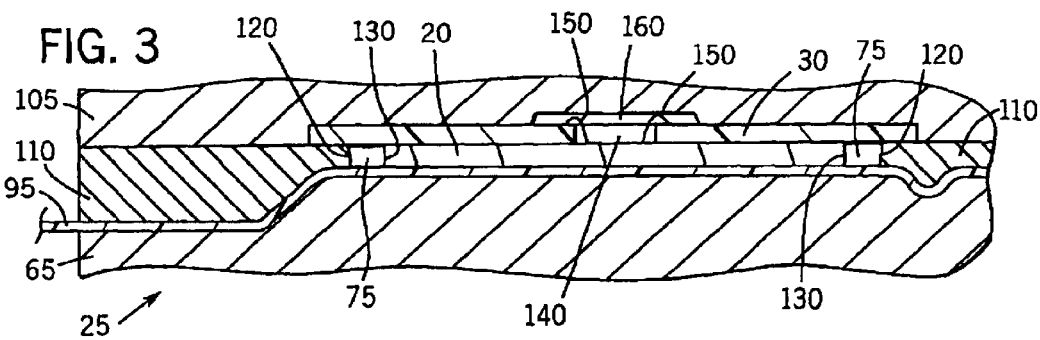
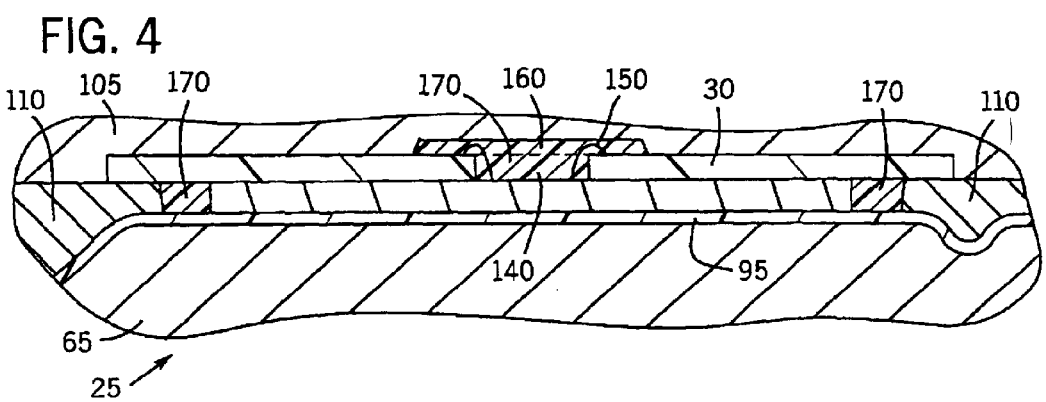
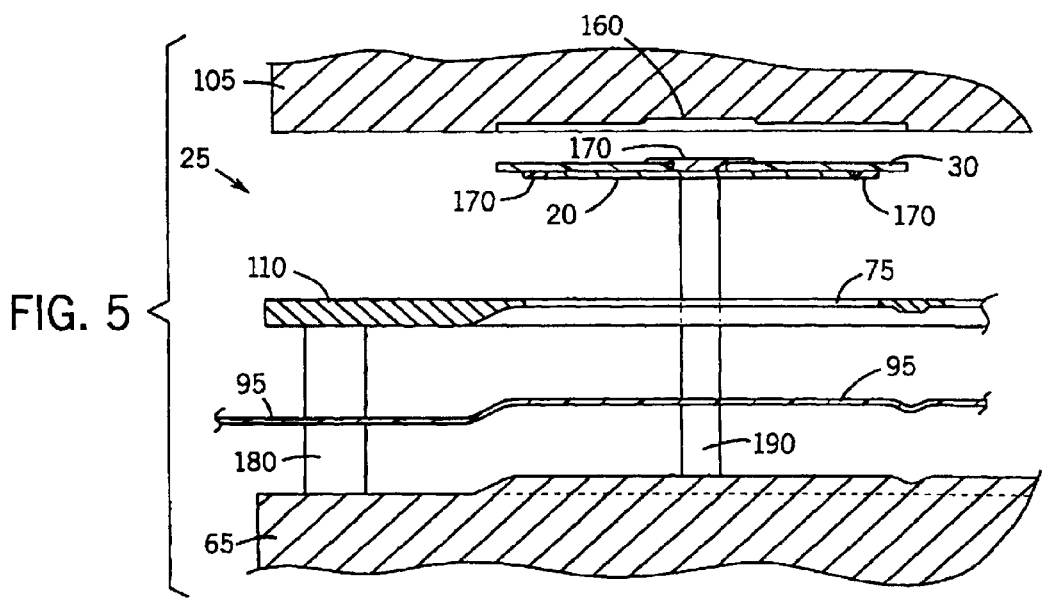

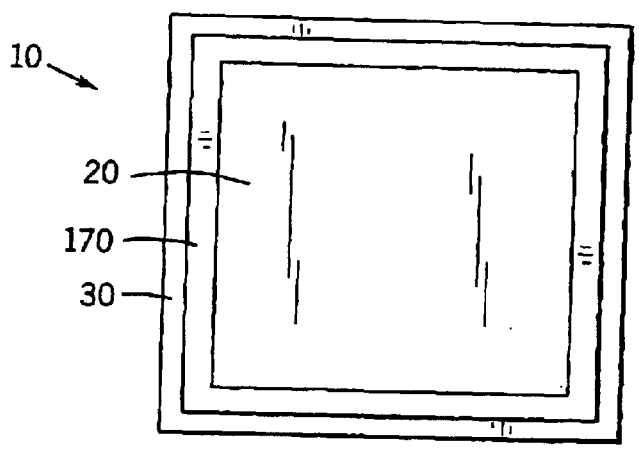
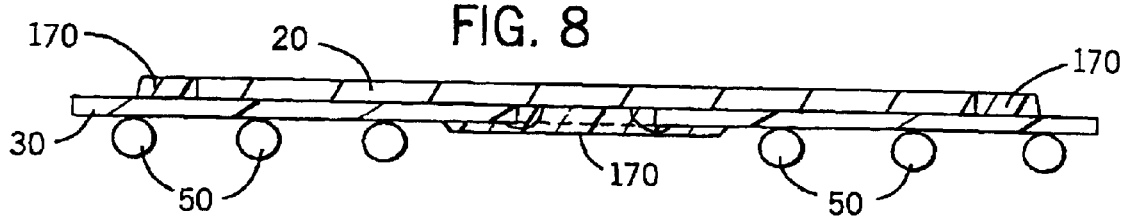
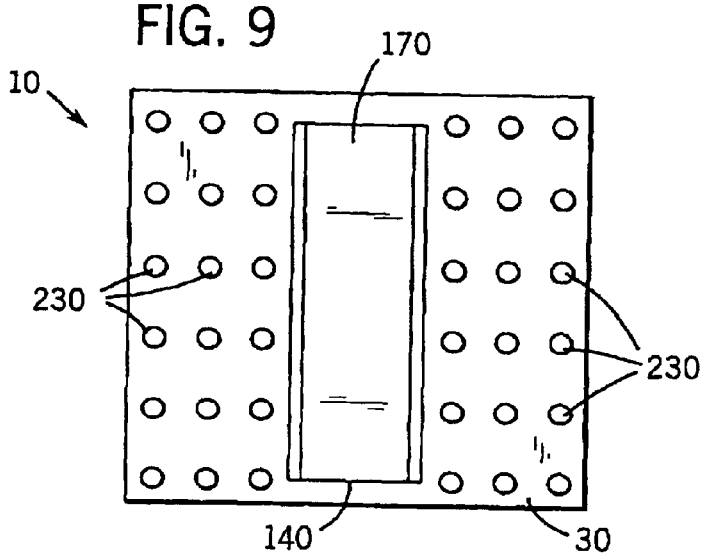

EXPOSED DIE MOLDING APPARATUS

BACKGROUND OF THE INVENTION

1. Field Of The Invention

The present invention relates generally to microelectronic packaging and, more particularly, to a method and apparatus for applying a protective ring about the perimeter of an exposed die face.

2. Description Of The Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Packaging of electrical circuits is a key element in the technological development of any device containing electrical components. Several technologies have been developed to provide a means of mounting these electrical components on a surface such as a printed circuit board (PCB). Fine pitch surface mount (FPT), pin grid array (PGA), and ball grid array (BGA) are examples of leading surface mount technologies.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multi-layer interconnect options; higher IO's for a given footprint; easier extension to multi-chip modules; and faster design-to-production cycle time.

A BGA semiconductor package generally includes a semiconductor chip mounted on the upper surface of a substrate. The semiconductor chip may be electrically coupled to the substrate by bonding wires. The substrate contains conductive routing which allows the signals to pass from the semiconductor chip on the top side of the substrate, through the substrate, and to pads on the underside of the substrate. A plurality of solder balls are deposited and electrically coupled to the pads on the underside of the substrate to be used as input/output terminals for electrically connecting the substrate to a PCB or other external device.

To protect the semiconductor chip and bonding wires from external elements such as moisture, dust, or impact, the semiconductor chip is often encapsulated in a molding compound. To encapsulate the semiconductor chip, vacuum based systems are implemented to inject a molding compound which completely encompasses the chip. Disadvantageously, by encasing the entire semiconductor chip in a molding compound, the overall height of the circuit package will be increased. Further, the current system for encapsulating the semiconductor chip implements vacuum ports to seat the film which is used to separate the molding compound from the packaging system after encapsulation is complete. These vacuum ports may become contaminated with the molding compound which is used to encase the semiconductor chip.

The present invention may address one or more of the problems set forth above.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a system for molding a circuit package. The system comprises a first support plate, a second support plate, and a cavity plate which is positioned between the first and second support plates during the encapsulation process. The cavity plate has an aperture configured to receive a protruding portion of the circuit package. The circuit package generally contains a semiconductor chip which is attached to a substrate. The semiconductor chip is generally the protruding portion of the circuit package.

In accordance with another aspect of the present invention, there is provided an open-faced circuit package. The circuit package generally contains a semiconductor chip which is attached to a substrate. A molding compound is disposed onto the substrate surface to form a protective ring about the periphery of the semiconductor chip, leaving the top surface of the semiconductor chip void of any molding compound.

In accordance with still another aspect of the present invention, there is provided a method for molding a circuit package. The method comprises the steps of: disposing the circuit package on a cavity plate; disposing the cavity plate on a first support plate; disposing a second support plate on the cavity plate; injecting a molding compound into the cavity plate; separating the second support plate from the cavity plate; separating the cavity plate from the first support plate; and separating the circuit package from the cavity plate.

One advantage of the present invention is that there is no additional height added to the top of the circuit package during the encapsulation process. Further, because the face of the die is left exposed, the circuit package will advantageously dissipate heat rapidly. A second advantage of the present invention is that the apparatus used during the injection process does not require a vacuum system. Therefor, the system may be easier to implement in current fabrication facilities. Also, one problem associated with vacuum-based systems is that the vacuum system often becomes contaminated with molding compound during the injection process. A vacuumless system will not have this problem.

BRIEF DESCRIPTION OF THE DRAWINGS

The foregoing and other advantages and features of the invention will become apparent upon reading the following detailed description and upon reference to the drawings in which:

FIG. 3 illustrates a partial cross-sectional side view of an encapsulation system and of a circuit package to be encapsulated in accordance with the present invention;

FIG. 4 illustrates a partial cross-sectional side view of an encapsulation system and of a circuit package after a molding compound has been injected in accordance with the present invention;

FIG. 5 illustrates a partial cross-sectional view of an encapsulation system and of a circuit package after it has been injected with a molding compound and ejected from the molding system;

FIG. 7 illustrates a top plan view of a post encapsulation circuit package;

FIG. 8 illustrates a partial cross-sectional side view of a post encapsulation circuit package in accordance with the present invention; and FIG. 9 illustrates a plan view of the backside of a post encapsulation circuit package in accordance with the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
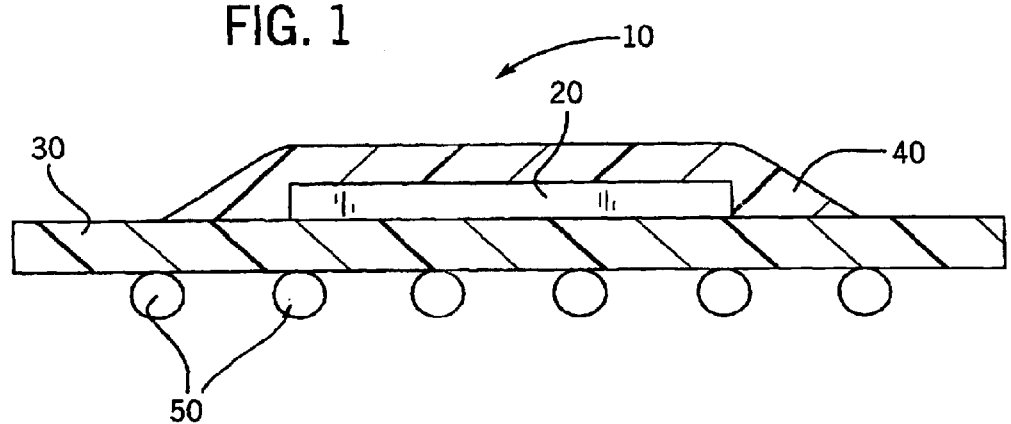
FIG. 1 illustrates an exemplary encapsulated circuit package.

Turning now to the drawings, and referring initially to FIG. 1, a partial cross-sectional view depicting an exemplary encapsulated circuit package generally designated by reference numeral 10 is illustrated. The circuit package 10 typically includes a semiconductor chip 20, such as a memory die. The semiconductor chip 20 is mounted on a substrate 30 and electrically coupled to the substrate 30 by bond wires (not shown). A molding compound 40 is generally used to encapsulate the semiconductor chip 20. The purpose of the molding compound 40 is to protect the semiconductor chip 20 and the bond wires (not shown) from external elements. Solder balls 50 may be deposited on the back side of the substrate 30 so that the circuit package 10 may be electrically coupled to a printed circuit board (PCB) in order to incorporate the circuit package 10 into a system.

Figure 2:
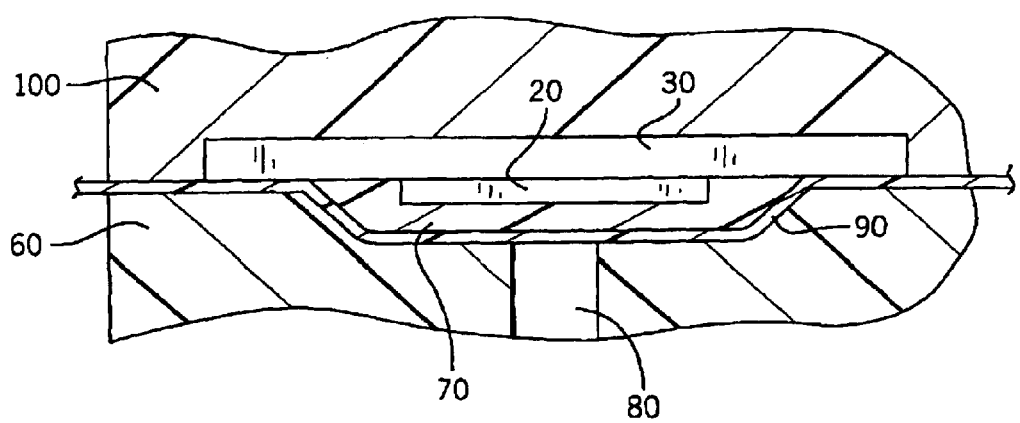
FIG. 2 illustrates an exemplary encapsulating process.

FIG. 2 illustrates a method and apparatus for encapsulating a circuit package 10. A bottom support plate 60 is generally made of a rigid substance such as metal. The bottom support plate 60 contains a molding cavity 70 which is used to encapsulate the circuit package 10. The bottom support plate 60 also contains vacuum holes 80 which are used to seat a film 90 in the molding cavity 70. The film 90 separates the molding compound from the molding equipment once the semiconductor chip 20 has been encapsulated.

To encapsulate the semiconductor chip 20, the circuit package 10 is placed on the support plate 60 so that the edges of the substrate 30 are in contact with the film 90, and so that the semiconductor chip 20 occupies the molding cavity 70. The semiconductor chip 20 is not in contact with the bottom support plate 60 or the film 90, but rather is suspended in the molding cavity 70 to be injected with a molding compound. A top support plate 100 is generally used to secure the circuit package 10 during the injection process. During the encapsulation process, a molding compound, such as a resin, is injected into the molding cavity 70. Once the molding compound solidifies, the circuit package 10 is removed from the molding equipment.

This method of "die side down" encapsulation described above presents several problems. First, many such molding machines do not use a vacuum to seat the film 90 during this type of molding procedure. Thus, such equipment must be modified to facilitate this type of encapsulation. Second, the vacuum assist which is used to seat the film 90 in the molding cavity 70 often creates wrinkles in the film 90, which are subsequently transferred into the molding compound and, finally, to the encapsulated circuit package 10. Third, this method of encapsulation adds additional undesirable thickness to the circuit package 10. The overall height increase of the circuit package is generally 100–300 microns.

To address these shortcomings, FIGS. 3–9 illustrate an exposed die molding apparatus and a method for producing an exposed die molded circuit package. FIGS. 3–5 illustrate the manner in which the molding process generally operates. Specifically, FIG. 3 illustrates a partial cross-section of the circuit package 10 mounted in the molding apparatus 25, in accordance with the present invention. The film 95 is brought in contact with the bottom support plate 65. The cavity plate 110 is seated on top of the film 95. The cavity plate 110 contains a molding cavity 75. Here, the depth of the molding cavity 75 is approximately equal to the thickness of the semiconductor chip 20. As the circuit package 10 is mounted die side down within the cavity plate 110, the semiconductor chip 20 is brought in contact with the film 95 since the walls of the molding cavity 75 are only about as high as the semiconductor chip 20. The cavity plate 110 is constructed such that the molding cavity 75 may receive the semiconductor chip 20 while the substrate 30 is disposed upon the top surface of the cavity plate 110. As the cavity plate 110 is disposed upon the film 95 the raised portion of the bottom support plate 65 is brought in contact with the top surface of the semiconductor chip 20, with only the film 95 separating the two plates. Thus, the molding cavity 75 is formed by the molding cavity sidewall 120 which is part of the cavity plate 110, and the edge of the semiconductor chip 20, shown as reference number 130. The floor of the molding cavity 75 is formed when the cavity plate 110 is disposed on the film 95. The substrate 30 provides the final containment surface to form the molding cavity 75. The top support plate 100 is disposed upon the cavity plate 110 and the substrate 30 to secure the circuit package 10 during the molding compound injection process.

FIG. 3 also illustrates a substrate slot 140. The substrate slot 140 is actually a slot which has been cut in the substrate to allow the bond wires from the semiconductor chip 20 to be electrically coupled to the substrate 30. In one embodiment, the semiconductor chip 20 is electrically coupled to the substrate 30 by bond wires 150. Exemplary bond wires 150 are illustrated. Because one of the purposes of the molding compound is to protect the electrical connections such as bond wires 150, the molding compound is advantageously injected about the connections. Thus, the cavity plate 10 is constructed such that the molding compound will flow through the substrate slot 140 to encapsulate the bond wires 150. To encapsulate the bond wires 150 completely, the top support plate 105 contains a molding pocket 160.

FIG. 4 illustrates the apparatus disclosed in FIG. 3 after the molding compound 170 has been injected into the system. The hatch lines in FIG. 4 illustrate where the molding compound 170 has been injected. It is significant to note that the molding compound is not injected onto the top surface of the semiconductor chip 20. Thus, there is no additional height added to the circuit package 10.

Significantly, the disclosed apparatus 25 does not require a vacuum system to seat the film 95 against the bottom support plate 65. Because the top surface of the semiconductor chip 20 is disposed directly upon the film 95 with no space left in the molding cavity 75 to allow the top side of the semiconductor chip 20 to be encapsulated, the film 95 will automatically be pressed flat once the cavity plate 110 is disposed upon the bottom support plate 65. Thus, the vacuum system which was used in the conventional encapsulating machines is no longer utilized to assist in seating the film 95 flush with the bottom support plate 65 to form the top surface of the molding cavity 75.

FIG. 5 illustrates the circuit package 10 after the molding compound 170 has solidified, and the circuit package 10 has been ejected. The apparatus 25 used to encapsulate the circuit package 10 will be explained in greater detail in FIGS. 6A and 6B. The purpose of FIG. 5 is simply to illustrate the completed stage of the encapsulation process. FIG. 5 thus contains the same elements as FIGS. 3 and 4. Once the molding compound 170 solidifies, the circuit package 10 may be ejected from the encapsulation system. The cavity plate 110 is separated from bottom support plate 65 by any suitable means, such as a cavity plate push rod 180, for example. The cavity plate push rod 180 is a rod which may be contained within the bottom support plate 65 during the encapsulation process. Once the process is complete and the molding compound 170 solidifies, the cavity plate push rod 180 is extended thereby elevating the cavity plate 110 from its prior position (as shown in FIGS. 3 and 4). As the cavity plate 110 is elevated by the cavity plate push rod 180, the film 95 returns to its feed position as will be shown in FIG. 6B (since the cavity plate 110 is no longer forcing the film 95 downwardly into contact with the bottom support plate 65). The bottom support plate 65 may also contain rail ejection pins 190 which are used to eject an encapsulated circuit package 10 from the cavity plate 10 after the molding injection process is complete.

Figures 6A, 6B:
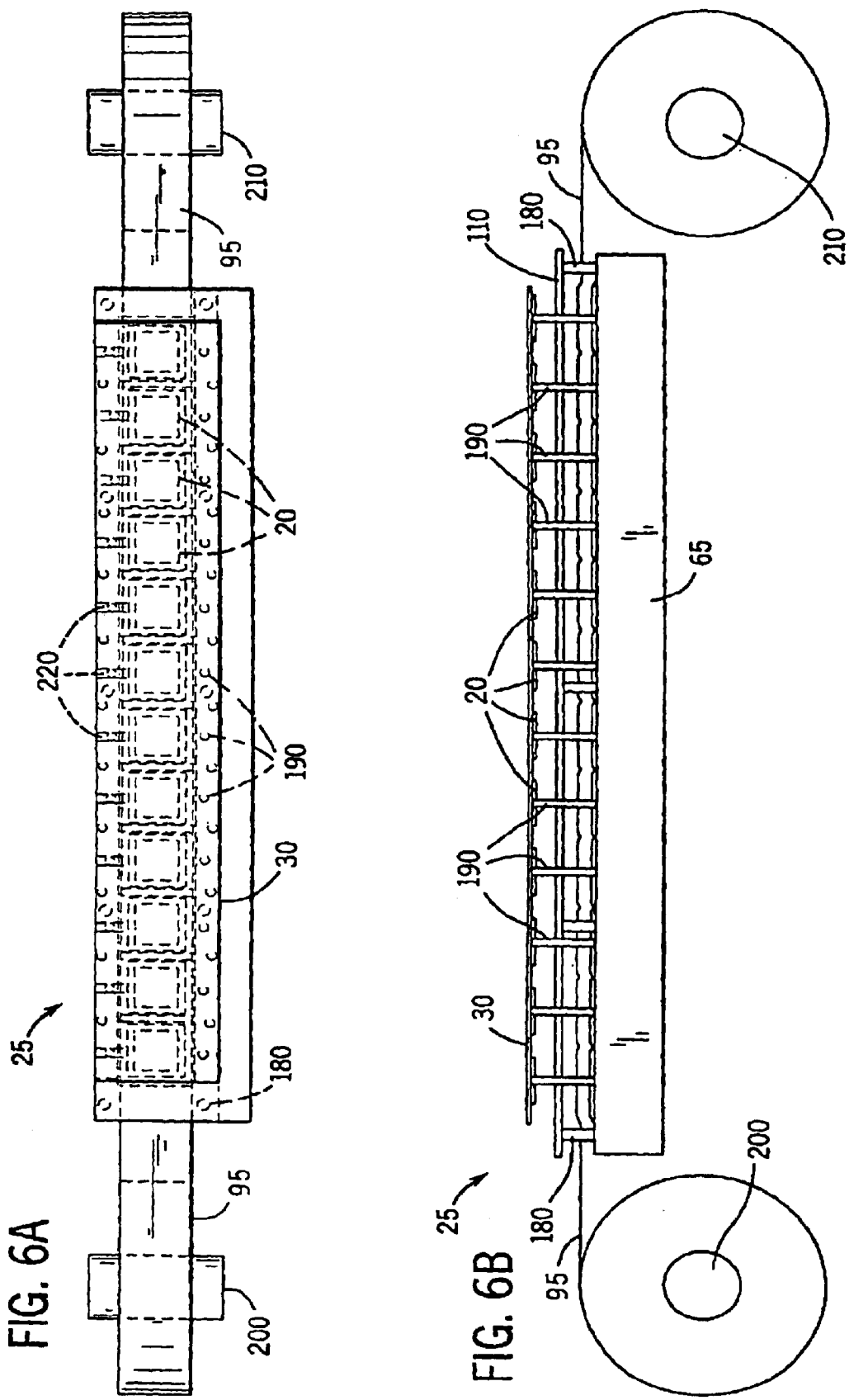
FIGS. 6A and 6B illustrate respectively a top view and a side elevation view of an encapsulation system in accordance with the present invention.

Turning now to FIGS. 6A and 6B, the molding process and apparatus 25 can be better explained. FIG. 6A illustrates a top plan view, and FIG. 6B illustrates a side view of a molding apparatus 25. Referring first to the side view of FIG. 6B, the apparatus 25 is shown in its ejected position. As can be seen, the film 95 is positioned proximate to the bottom support plate 65. The film is held in place during processing by a feed roller 200 and a take up roller 210. During the injection processing, the cavity plate push rods 180 and the rail ejection pins 190 are contained within the bottom support plate 65. The cavity plate 110 is thus sitting on top of the film 95 which in turn forces the film 95 downwardly and against the bottom support plate 65. The substrate 30 which is coupled to the semiconductor chip 20 is disposed on the cavity plate 110. At this point in the processing, the substrate 30 contains a plurality of semiconductor chips 20. After injection of the molding compound 170 (not shown) and removal from the injection apparatus 25, the substrate 30 will be cut to provide individual circuit packages 10.

When the apparatus 25 is in its injection position (as shown in FIGS. 3 and 4), the molding compound is injected through a molding compound injection slot 220. Once the molding compound has solidified, the cavity plate 110 is elevated by the cavity plate push rod 180. The substrate 30 is then removed by pushing it out of the cavity plate 10 by means of the rail ejection pins 190. Thus, once the injection process is complete and before the substrate 30 is removed from the apparatus 25, the apparatus 25 will look like the side view shown in FIG. 6B and the partial cross-sectional view shown in FIG. 5. As should be evident from these figures, there is no need for a vacuum apparatus to be contained within the bottom support plate 65 to seat the film 95 during the injection processing since the cavity plate 10 will force the film 95 flat against bottom support plate 65. For simplicity, the top support plate 105 is not illustrated in the present figure. However, it should be understood that the top support plate 105 is also positioned on top of the cavity plate 10 during the injection processing.

In an alternate embodiment, the film 95 may be omitted. One of the other purposes of the film 95 may be to account for height differences in circuit packages 10. To ensure that all semiconductor chips 20 are seated flush against the bottom support plate 65, the film 95 may be comprised of a resilient material which ensures contact despite height variations in substrate packages 10. However, if the bottom cavity plate 65 is comprised of a resilient material, such as composite material, rather than a solid material, such as metal, the film 95 may not be necessary.

FIGS. 7, 8 and 9 illustrate the separated circuit package 10 once the injection processing is complete. FIG. 7 illustrates a top plan view of the circuit package 10. As can be seen, the molding compound 170 completely surrounds the semiconductor chip 20. In one embodiment, the molding compound 170 does not extend to the edge of the substrate 30. However, it should be appreciated that the molding compound 170 could be extended to the edge of the substrate 30 or with a different cavity plate fixture the molding compound 170 could extend beyond the edges of the substrate 30, in such a way so as to contain the substrate 30 completely within the molding compound 170.

FIG. 8 illustrates a partial cross-sectional view of the circuit package 10 after the injection process. It can be seen that the molding compound 170 does not extend above the height of the semiconductor chip 20. Because the semiconductor chip 20 is left with its face exposed, there is no additional height added to the circuit package 10 by the injection processing. Solder balls 50 may be attached to the substrate 30 to couple the circuit package 10 to another substrate or PCB for use in a system. However, it should also be appreciated that other means, such as pins, may be used to electrically couple the circuit package 10 to another substrate or PCB.

FIG. 9 illustrates a top plan view of the back side of the circuit package 10. Again, in one particular embodiment of the present invention, solder pads 230 may be disposed upon the back side of the substrate 30 to receive solder balls 50 (not shown) for electrical coupling to a substrate or PCB for use in a system. Also, in this particular embodiment, the substrate 30 contains a slot 140 through which the semiconductor chip 20 (not shown) is coupled to the substrate 30 through the use of bond wires (not shown). Thus, in this embodiment it may also be desirable to inject molding compound 170 through the slot 140 to encase the bond wires to protect them from external contacts. It should be appreciated that if the semiconductor chip 20 is electrically coupled to the substrate 30 by some other means, the slot 140 in the substrate 30 may not be present and thus no molding compound 170 will be used in the region shown in FIG. 9.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for molding a circuit package comprising:
   a first support plate;
   a second support plate proximately positioned with respect to first support plate; and
   a cavity plate position between the first support plate and the second support plate, the cavity plate having an aperture configured to accept only a protruding portion of the circuit package such that the protruding portion of the circuit package contacts the first support plate, and wherein the aperture is sized to create a peripheral void about only the protruding portion of the circuit package to permit a molding compound to be disposed thereabout.

2. The system for molding a circuit package, as set forth in claim 1, wherein the first support plate is configured to support a plurality of circuit packages.

3. The system for molding a circuit package, as set forth in claim 1, wherein the first support plate is comprised of a rigid material.

4. The system for molding a circuit package, as set forth in claim 3, wherein the first support plate is comprised of metal.

5. The system for molding a circuit package, as set forth in claim 4, wherein the first support plate comprises a film disposed in contact with the protruding portion of the circuit package.

6. The system for molding a circuit package, as set forth in claim 5, wherein the film is comprised of a resilient material.

7. The system for molding a circuit package, as set forth in claim 1, wherein the first support plate is comprised of a resilient material.

8. The system for molding a circuit package, as set forth in claim 1, wherein the first support plate comprises a plateau which resides adjacent a recess in the cavity support plate.

9. The system for molding a circuit package, as set forth in claim 1, wherein the first support plate contains a plurality of cavity plate push rods.

10. The system for molding a circuit package, as set forth in claim 9, wherein the cavity plate push rods are mechanically controlled to separate the cavity plate from the first support plate.

11. The system for molding a circuit package, as set forth in claim 1, wherein the first support plate contains rail ejection pins.

12. The system for molding a circuit package, as set forth in claim 11, wherein the rail ejection pins are mechanically controlled to separate the circuit package from the cavity plate.

13. The system for molding a circuit package, as set forth in claim 1, wherein the second support plate comprises a cavity.

14. The system for molding a circuit package, as set forth in claim 13, wherein the cavity is positioned to permit a molding compound to be disposed within the cavity.

15. The system for molding a circuit package, as set forth in claim 1, wherein the aperture is the same height as the protruding portion of the circuit package.

16. The system for molding a circuit package, as set forth in claim 15, wherein the aperture is configured to yield a circuit package having its non-protruding surfaces completely covered with a molding compound.

17. The system for molding a circuit package, as set forth in claim 16, wherein the molding compound is an insulating material.

18. The system for molding a circuit package, as set forth in claim 1, wherein the protruding portion of the circuit package is a semiconductor chip.

19. The system for molding a circuit package, as set forth in claim 18, wherein the semiconductor chip is a memory device.

* * * * *